(12) United States Patent
Liu

(10) Patent No.: US 7,572,983 B2
(45) Date of Patent: Aug. 11, 2009

(54) PRINTED CIRCUIT BOARD

(75) Inventor: Jing Liu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 484 days.

(21) Appl. No.: 11/309,027

(22) Filed: Jun. 12, 2006

(65) Prior Publication Data
US 2007/0125573 A1    Jun. 7, 2007

(30) Foreign Application Priority Data
Jul. 22, 2005    (CN) .................. 2005 1 0036151

(51) Int. Cl.
*H01R 12/04* (2006.01)
*H05K 1/11* (2006.01)
(52) U.S. Cl. .................... 174/261; 174/260
(58) Field of Classification Search .......... 174/261, 174/254, 260
See application file for complete search history.

(56) References Cited

U.S. PATENT DOCUMENTS

| | | | |
|---|---|---|---|
| 5,128,832 A * | 7/1992 | Lawrence | 361/775 |
| 5,303,122 A | 4/1994 | Adams, Jr. et al. | |
| 5,406,458 A | 4/1995 | Schutt | |
| 5,425,647 A | 6/1995 | Mencik et al. | |
| 5,453,581 A | 9/1995 | Liebman et al. | |
| 5,729,439 A * | 3/1998 | Saito | 361/760 |
| 5,805,428 A * | 9/1998 | Singer | 361/777 |
| 7,223,921 B2 * | 5/2007 | Rissing et al. | 174/254 |

* cited by examiner

*Primary Examiner*—Jeremy C Norris
(74) *Attorney, Agent, or Firm*—Wei Te Chung

(57) ABSTRACT

A printed circuit board includes a plurality of pairs of first bond pads mounted on an area of a surface thereof, and a plurality of pairs of second bond pads mounted to on the same area thereof. One first bond pad of each pair is electrically connected to a first signal wire. The other first bond pad of each pair is electrically connected to a second signal wire. One second bond pad of each pair is connected to a first bond pad of one pair that are connected with the first signal wire. The other second bond pad of each pair is connected to a first bond pad of another pair that is connected with the second signal wire.

9 Claims, 7 Drawing Sheets

PRINTED CIRCUIT BOARD

FIELD OF THE INVENTION

The present invention relates to printed circuit boards, and particularly to a printed circuit board with space saving layout.

DESCRIPTION OF RELATED ART

Advancements in the electronic industry has created a growing demand for more electronic components to be integrated onto a single printed circuit board. Meanwhile, electronic devices are becoming smaller to satisfy tastes of users. Thus, we have a need for smaller printed circuit boards with more components. So, a reasonable space-saving layout for the printed circuit board is needed for mounting so many electronic components in such a limited space.

Conventionally, a printed circuit board matching with a 775 Central Processing Unit (CPU) needs a plurality of surface mount components, such as C1206 capacitors or tantalum capacitors, to be mounted thereon. Thus, two separate areas are arranged on the printed circuit board for mounting the C1206 and the tantalum capacitors. In one area, there are pairs of first bond pads for mounting C1206 capacitors. In the other area, there are second bond pads for mounting tantalum capacitors. One bond pad of each pair of the first bond pads and the second bond pads is connected to a first signal wire. The other bond pad of each pair of the first bond pads and the second bond pads is connected to a second signal wire.

Referring to FIG. 5, a printed circuit board 60 of one type of layout has a first area 65 and a second area 66 on the surface. A plurality of first bond pads 61 is mounted to the first area 65 under a 775 CPU (not shown). A plurality of second bonds pads 62 is mounted to the second area 66 outside the area reserved for the 775 CPU. This type of layout needs two areas for mounting which is a waste of space on the circuit board 60 because the two types of capacitors are not used at the same time. Either one or the other type of capacitor is mounted on the board at any time. Referring to FIGS. 6 and 7, a printed circuit board of the other type of layout has a first area 75 on a surface of a circuit board 70, and a second area (not labeled) on an opposite surface of the circuit board. A plurality of first bond pads 71 is mounted to the first area 75 under a 775 CPU. A plurality of second bonds pads 72 is mounted to the second area. Although this type of layout does save space, manufacturing such printed circuit boards is difficult.

What is desired, therefore, is a printed circuit board which readily saves space but with a less difficult manufacturing process.

SUMMARY OF THE INVENTION

An exemplary printed circuit board includes a plurality of pairs of first bond pads mounted to a surface thereof, and a plurality of pairs of second bond pads mounted to a same surface thereof overlapping the first bond pads. One first bond pad of each pair is electrically connected to a first signal wire. The other first bond pad of each pair is electrically connected to a second signal wire. One second bond pad of each pair is connected to a first bond pad of one pair that are connected with the first signal wire. The other second bond pad of each pair is connected to a first bond pad of another pair that is connected with the second signal wire.

Other advantages and novel features will become more apparent from the following detailed description when taken in conjunction with the accompanying drawings, in which:

DETAILED DESCRIPTION OF THE INVENTION

Figure 1:
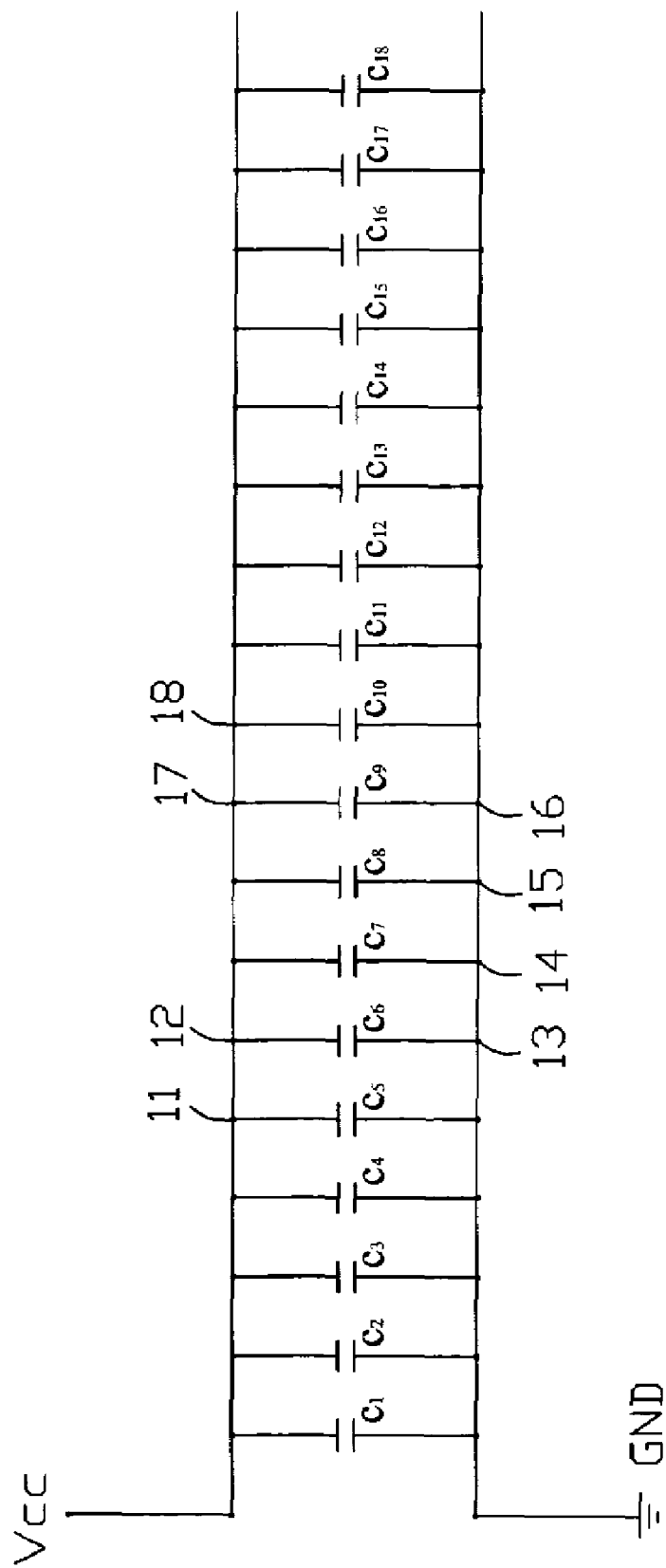
FIG. 1 is a circuit diagram of a first type of capacitors.
Figure 2:
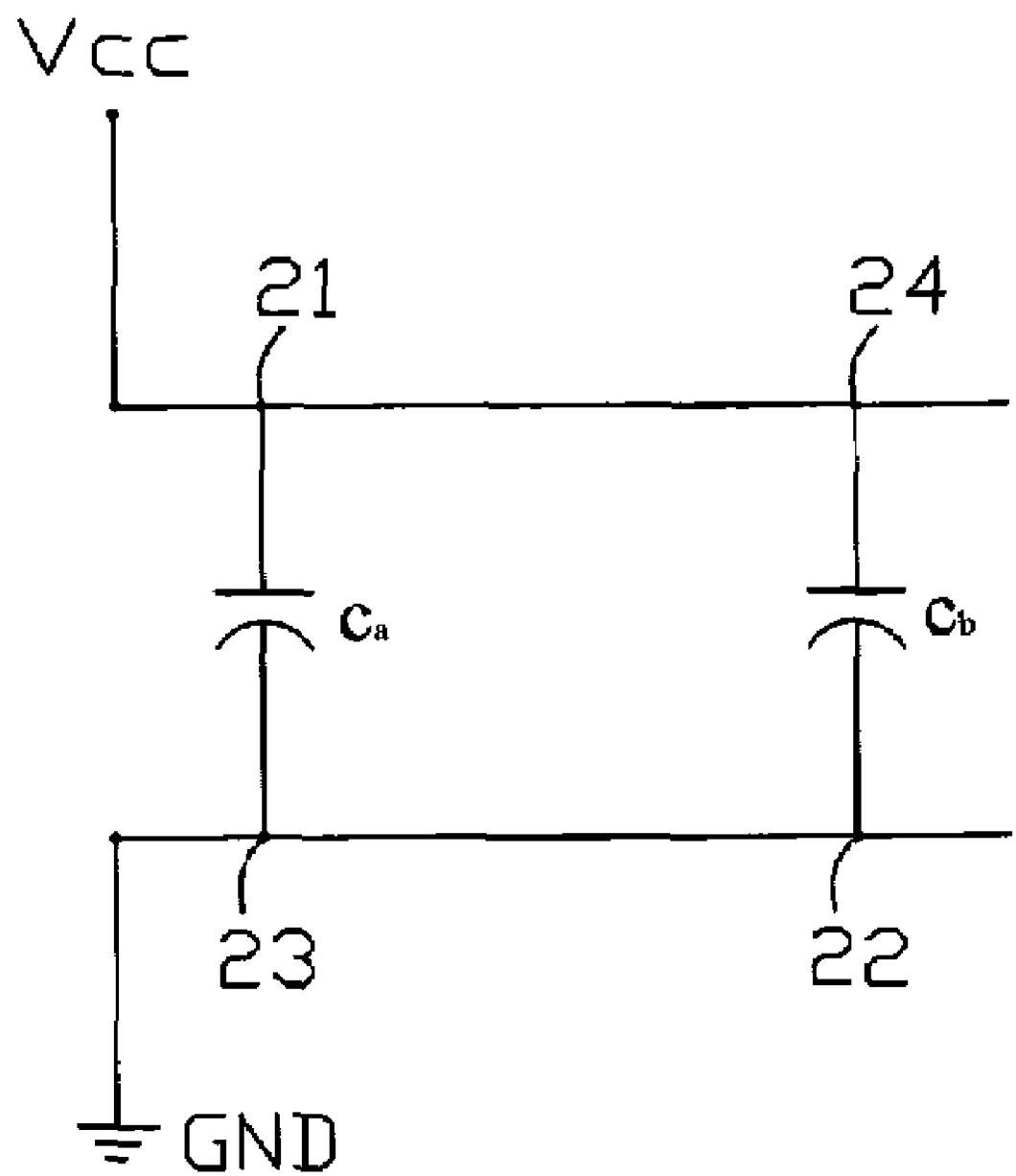
FIG. 2 is a circuit diagram of a second type of capacitors.
Figure 3:
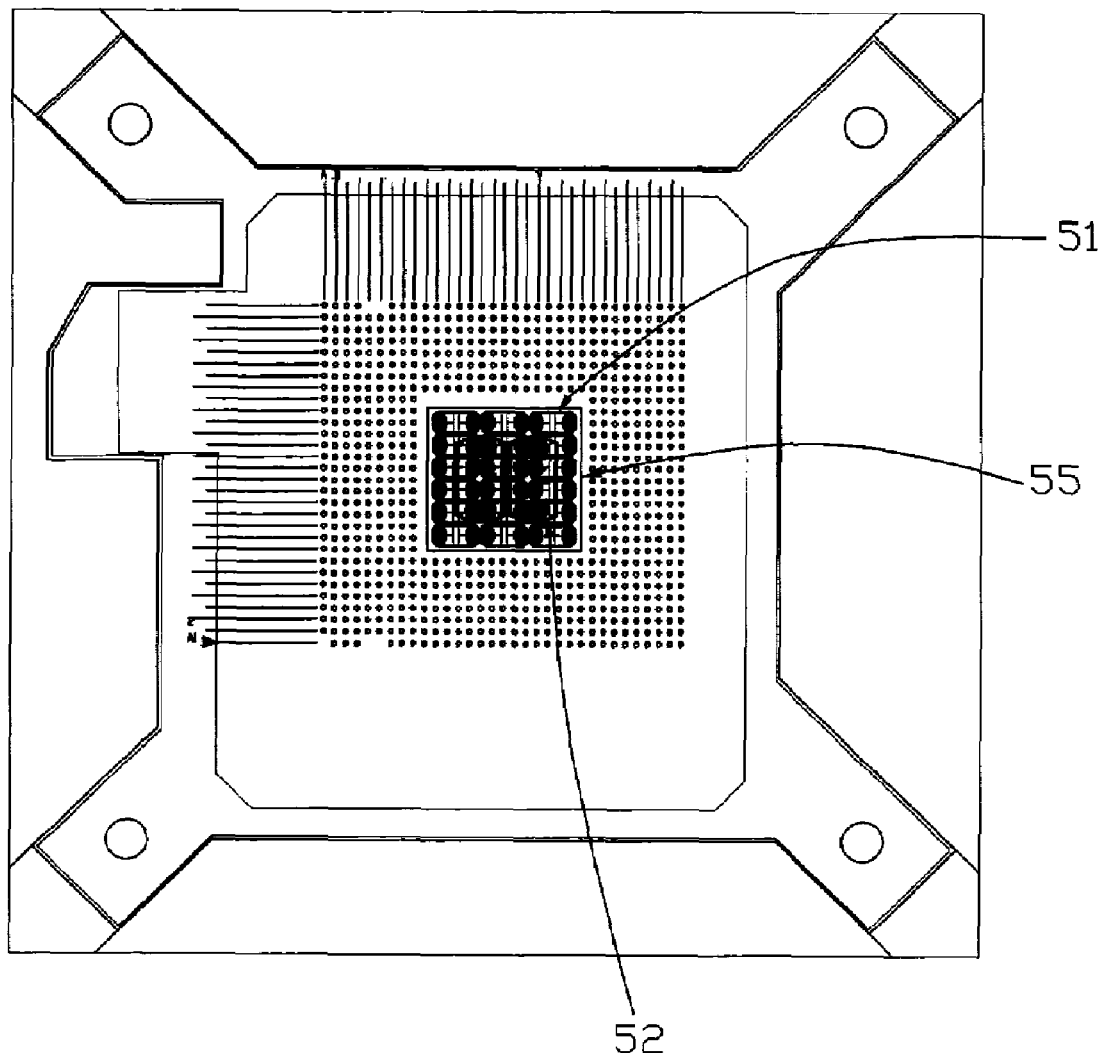
FIG. 3 is a top plan view of a printed circuit board in accordance with a preferred embodiment of the present invention, for mounting the first type of capacitors of FIG. 1, and the second type of capacitors of FIG. 2.
Figure 4:
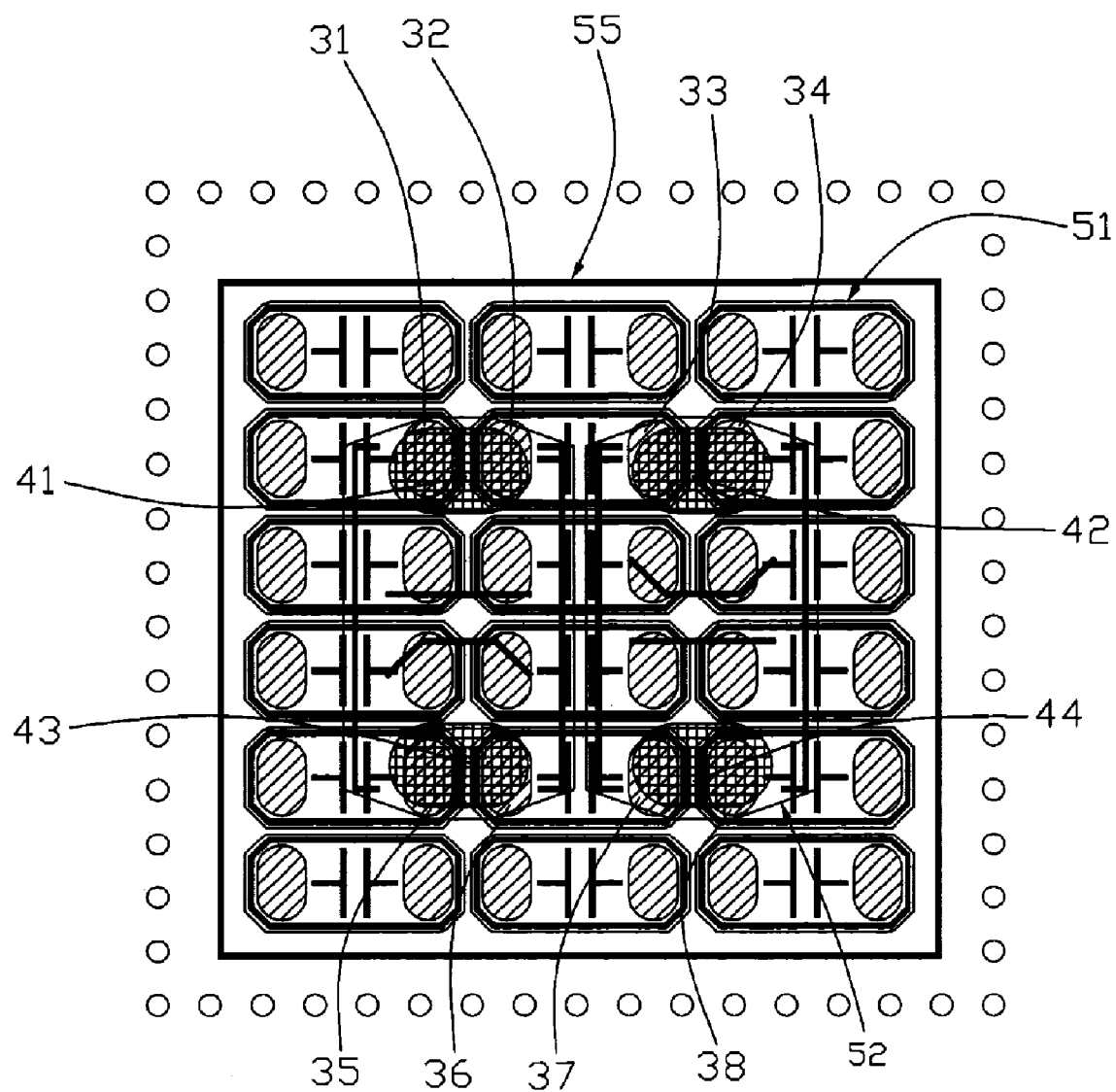
FIG. 4 is a partial, enlarged view of FIG. 3.
Figure 5:
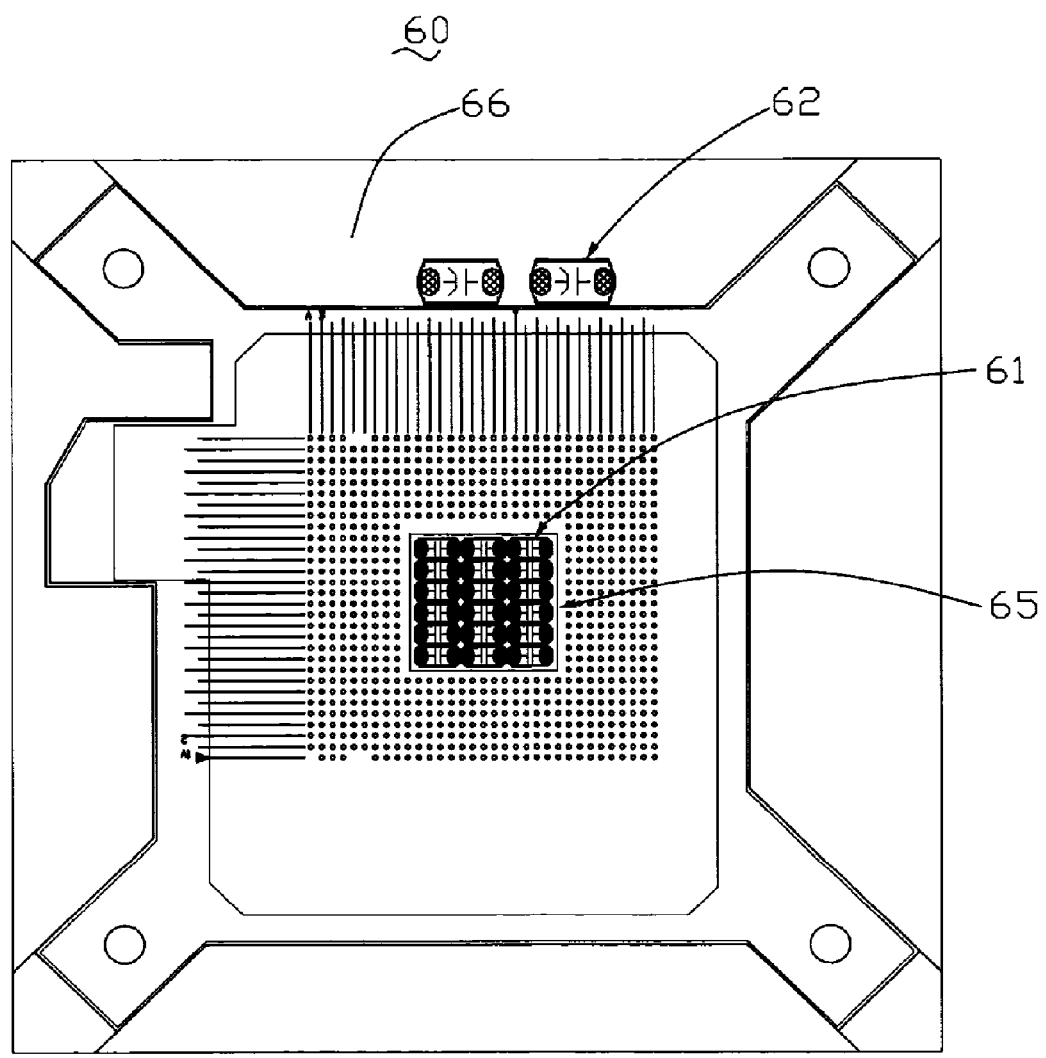
FIG. 5 is a plan view of a conventional printed circuit board for mounting a first type of capacitors and a second type of capacitors.
Figure 6:
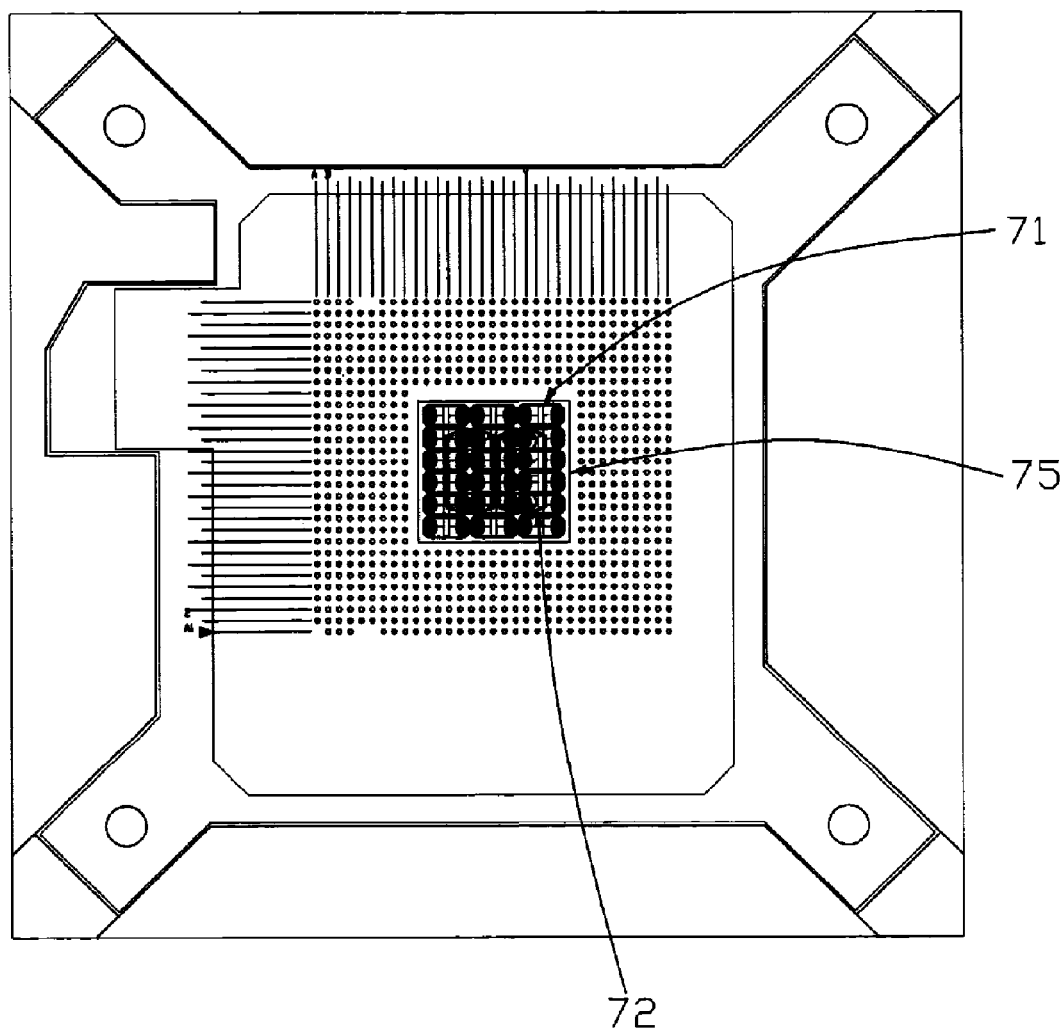
FIG. 6 is a top plan view of an alternative conventional printed circuit board for mounting a first type of capacitors and a second type of capacitors.
Figure 7:
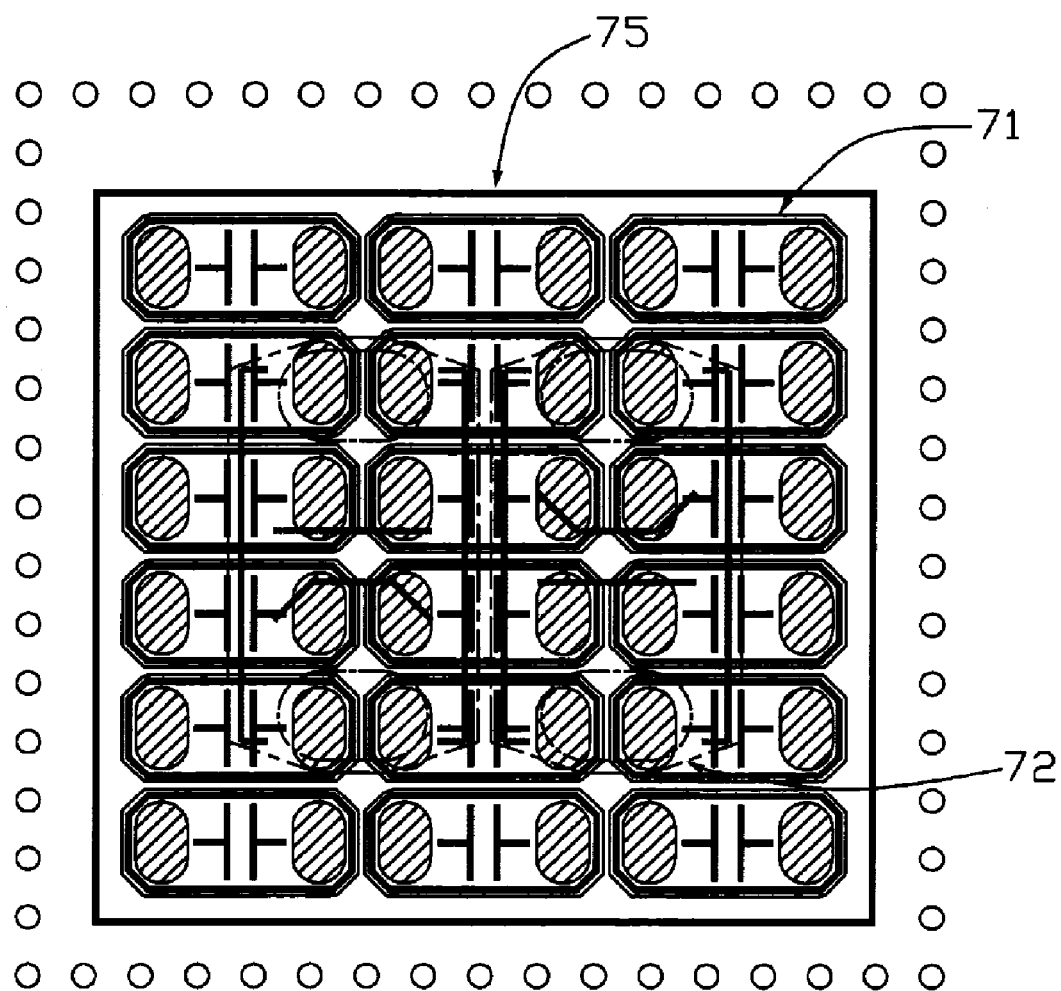
FIG. 7 is a partial, enlarged view of FIG. 6.

Referring to FIGS. 1 to 4, a circuit assembly like a printed circuit board in accordance with a preferred embodiment of the present invention is shown for mounting a plurality of first components, such as C1206 capacitors C1, C2 . . . C18, or a plurality of second components, such as tantalum capacitors Ca and Cb.

The printed circuit board includes an area 55 on a surface of a substrate thereof. Eighteen pairs of first bond pads 51 are mounted to the area 55, each pair for a first capacitor to be mounted thereon. Two pairs of second bond pads 52 are also mounted to the area 55, each pair for a second capacitor to be mounted thereon. A plurality of mounting holes (not labeled) is defined in the printed circuit board around the area 55 for mounting a 775 CPU (not shown).

Ends 11, 12, 17, 18 of the first capacitors C5, C6, C9, C10 are mountable to respective first bond pads 31, 32, 37, 38 that are electrically connected to power signal wires. Ends 13, 14, 15, 16 of the first capacitors C6, C7, C15, C16 are mountable to respective first bond pads 33, 34, 35, 36 that are electrically connected to grounding signal wires. Ends 21, 24 of the second capacitors Ca, Cb are mountable to respective second bond pads 41, 44 that are electrically connected to power signal wires. Ends 23, 22 of the second capacitors Ca, Cb are mountable to respective second bond pads 43, 42 that are electrically connected to grounding signal wires. One second bond pad connecting to the power signal wires of each pair is mounted to two corresponding first bond pads of two pairs that connect to the power signal wires. The other second bond pad connecting to the grounding signal wires of each pair is mounted to two corresponding first bond pads of the two pairs that connect to the grounding signal wires. The first and second bond pads are mounted in the same area thus, space on the printed circuit board is saved, and the printed circuit board is easily manufactured.

On the printed circuit board of the preferred embodiment, the first capacitors and the second capacitors are not both mounted at the same time. When using the first capacitors, the second capacitors are not mounted to the second bond pads 41-44. Thus, the second bond pads 41-44 do not affect the first capacitors mounted to the printed circuit board. When using the second capacitors, the first capacitors are not mounted to the first bond pads 31-38. Thus, the first bond pads 31-38 do not affect the second capacitors mounted to the printed circuit board.

It is believed that the present embodiment and its advantages will be understood from the foregoing description, and it will be apparent that various changes may be made thereto without departing from the spirit and scope of the invention or sacrificing all of its material advantages, the example hereinbefore described merely being a preferred or exemplary embodiment of the invention.

What is claimed is:

1. A printed circuit board comprising:
   a plurality of pairs of first bond pads mounted to a surface thereof, one first bond pad of each pair electrically connected to a first signal wire, the other first bond pad of each pair electrically connected to a second signal wire; and
   a plurality of pairs of second bond pads mounted to the same surface thereof overlapping the first bond pads, one second bond pad of each pair connected to a first bond pad of one pair that are connected with the first signal wire, the other second bond pad of each pair connected to a first bond pad of another pair that are connected with the second signal wire.

2. The printed circuit board as claimed in claim 1, wherein the first bond pads and the second bond pads are mounted to an area with a plurality of holes being defined therearound for mounting a 775 CPU.

3. The printed circuit board as claimed in claim 2, wherein a plurality of C1206 capacitors is mounted to pairs of first bond pads, respectively.

4. The printed circuit board as claimed in claim 2, wherein a plurality of tantalum capacitors is mounted to pairs of second bond pads, respectively.

5. A printed circuit board comprising:
   two pairs of first bond pads, one first bond pad of each pair electrically connected to a first signal wire, the other first bond pad of each pair electrically connected to a second signal wire;
   a pair of second bond pads, one second bond pad electrically connected to the first bond pads that are connected to the first signal wire, the other second bond pad electrically connected to the first bond pads that are connected to the second signal wire; and
   a selective one of two components installable to the printed circuit board, wherein one of the two components uses one end thereof to be connected to the second bond pad that is connected to the first signal wire, and the other end thereof to be connected to the second bond pad that is connected to the second signal wire, while the other of the two component uses one end thereof to be connected to the first bond pad of a corresponding pair that is connected to the first signal wire, and the other end thereof to be connected to the first bond pad of the corresponding pair that is connected to the second signal wire.

6. The printed circuit board as claimed in claim 5, wherein the first bond pads and the second bond pads are mounted to an area with a plurality of holes being defined therearound for mounting a 775 CPU.

7. The printed circuit board as claimed in claim 6, wherein the two components comprise a tantalum capacitor mounted to the second bond pads, and at least one C1206 capacitor mounted to the first bond pads.

8. A circuit assembly comprising:
   a substrate of said circuit assembly defining a first signal wire and a second signal wire thereon;
   a first type of electronic components expressively performing a first function for said circuit assembly, each of said first type of components comprising a first end electrically connectable with said first signal wire, and a second end electrically connectable with said second signal wire;
   a second type of electronic components expressively performing a second function for said circuit assembly, each of said second type of components comprising a third end electrically connectable with said first signal wire, and a fourth end electrically connectable with said second signal wire;
   a plurality of bond pads attachably formed at said substrate, and comprising a first type of pads and a second type of pads, a portion of said first type of pads electrically connectable to said first signal wire in order to allow said first end of said each of said first type of components electrically connectable to said first signal wire via said portion of said first type of pads, the other portion of said first type of pads electrically connectable to said second signal wire in order to allow said second end of said each of said first type of components electrically connectable to said second signal wire via said other portion of said first type of pads, a portion of said second type of pads electrically connectable to said first signal wire in order to allow said third end of said each of said second type of components electrically connectable to said first signal wire via said portion of said second type of pads, the other portion of said second type of pads electrically connectable to said second signal wire in order to allow said fourth end of said each of said second type of components electrically connectable to said second signal wire via said other portion of said second type of pads, each of said second type of pads overlapping at least two of said first type of pads in order to occupy a same area at said substrate as said at least two of said first type of pads.

9. The circuit assembly as claimed in claim 8, wherein said at least two of said first type of pads are located closer to each other than to others of said first type of pads.

* * * * *